United States Patent
Kim et al.

(10) Patent No.: US 11,647,586 B2
(45) Date of Patent: May 9, 2023

(54) SUBSTRATE LAYERED STRUCTURE AND INTERPOSER BLOCK

(71) Applicant: LG ELECTRONICS INC., Seoul (KR)

(72) Inventors: Sanggeun Kim, Seoul (KR); Jungtae Seo, Seoul (KR); Kipoung Kim, Seoul (KR); Inkyu Park, Seoul (KR); Youngjik Lee, Seoul (KR); Youngkweon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 119 days.

(21) Appl. No.: 17/221,334

(22) Filed: Apr. 2, 2021

(65) Prior Publication Data
US 2022/0201860 A1     Jun. 23, 2022

(30) Foreign Application Priority Data
Dec. 21, 2020 (WO) ................ PCT/KR2020/018734

(51) Int. Cl.
| | |
|---|---|
| *H05K 1/14* | (2006.01) |
| *H05K 1/18* | (2006.01) |
| *H05K 1/11* | (2006.01) |
| *H05K 9/00* | (2006.01) |
| *G06F 1/16* | (2006.01) |
| *H04B 1/3888* | (2015.01) |

(52) U.S. Cl.
CPC ........... *H05K 1/145* (2013.01); *G06F 1/1626* (2013.01); *H05K 1/112* (2013.01); *H05K 1/181* (2013.01); *H05K 9/0024* (2013.01); *H04B 1/3888* (2013.01); *H05K 2201/09063* (2013.01); *H05K 2201/09609* (2013.01); *H05K 2201/10098* (2013.01); *H05K 2201/10378* (2013.01)

(58) Field of Classification Search
CPC ........ H05K 1/145; H05K 1/112; H05K 1/181; H05K 9/0024; H05K 2201/09609; G06F 1/1626–163
See application file for complete search history.

(56) References Cited

U.S. PATENT DOCUMENTS

| | | | |
|---|---|---|---|
| 5,703,753 A | 12/1997 | Mok | |
| 6,947,293 B2 * | 9/2005 | DiBene, II | ............ H01L 23/427 257/E23.09 |

(Continued)

FOREIGN PATENT DOCUMENTS

| | | |
|---|---|---|
| JP | 2010-219180 A | 9/2010 |
| KR | 10-2020-0116414 A | 10/2020 |

*Primary Examiner* — Hoa C Nguyen
(74) *Attorney, Agent, or Firm* — Birch, Stewart, Kolasch & Birch, LLP

(57) ABSTRACT

A substrate layered structure including a first circuit board; a second circuit board overlapping the first circuit board; and interposer blocks interposed between the first circuit board and the second circuit board and spaced apart from each other. Further, each corresponding interposer block includes a dielectric block body; a plurality of signal via holes passing through the dielectric block body and transferring signals between the first circuit board and the second circuit board; and a plurality of signal pads arranged at first ends of the signal via holes and connected to the first circuit board and arranged at second ends of the signal via holes and connected to the second circuit board.

19 Claims, 11 Drawing Sheets

(56) References Cited

U.S. PATENT DOCUMENTS

| | | | |
|---|---|---|---|
| 2004/0159925 A1* | 8/2004 | Matsuura | H05K 1/181 |
| | | | 257/E25.023 |
| 2009/0090001 A1* | 4/2009 | Taniguchi | B30B 5/02 |
| | | | 29/840 |
| 2012/0182699 A1* | 7/2012 | Zhang | H05K 1/141 |
| | | | 361/742 |
| 2013/0078915 A1 | 3/2013 | Zhao et al. | |
| 2013/0343015 A1* | 12/2013 | Malek | G06F 1/183 |
| | | | 361/752 |
| 2014/0021591 A1 | 1/2014 | Sung et al. | |
| 2019/0082536 A1* | 3/2019 | Park | G06F 1/263 |
| 2020/0266562 A1* | 8/2020 | Park | H05K 5/0004 |
| 2022/0005757 A1* | 1/2022 | Oh | H01L 23/562 |

* cited by examiner (a)

(b)

(c)

(d)

(a)

(b)

(a)

(b)

SUBSTRATE LAYERED STRUCTURE AND INTERPOSER BLOCK

CROSS-REFERENCE TO RELATED APPLICATION

This application claims the benefit of an earlier filing date and priority to PCT International Application No. PCT/KR2020/018734, filed on Dec. 21, 2020, the contents of which are incorporated by reference herein in its entirety.

BACKGROUND OF THE INVENTION

Field of the Invention

The present disclosure relates to a substrate layered structure configured by layering a plurality of substrates and an interposer block.

Discussion of the Related Art

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

As functions of the mobile terminal become more diversified, the number of cameras or antennas is increased and a battery capacity should be increased, whereby an inner space of the mobile terminal should be used more efficiently. A size of a space reserved by a printed circuit board may be reduced using a substrate layered structure in which a plurality of substrates are arranged in a thickness direction. The substrate layered structure needs a process of layering the substrates, and also needs signal communication and stable coupling between the layered substrates.

SUMMARY OF THE INVENTION

Accordingly, the present disclosure is directed to a substrate layered structure and an interposer block, which substantially obviate one or more problems due to limitations and disadvantages of the related art.

An object of the present disclosure is to provide a substrate layered structure and an interposer block, in which a manufacturing process of the substrate layered structure may be simplified, a coupling force between substrates may be enhanced, and a space on the substrates may be used to the maximum.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the invention, as embodied and broadly described herein, a substrate layered structure comprises a first circuit board; a second circuit board arranged to overlap the first circuit board; and interposer blocks arranged between the first circuit board and the second circuit board and spaced apart from each other, wherein each of the interposer blocks includes a block body including a dielectric; a plurality of signal via holes transferring a signal between the first circuit board and the second circuit board by passing through the block body; and a plurality of signal pads arranged at both ends of the signal via holes and connected with the first circuit board and the second circuit board.

The interposer block may include reinforcing pads arranged on one surface and the other surface of the block body, having a size greater than that of the signal pad.

The substrate layered structure may further comprise a plurality of ground via holes arranged between the reinforcing pads.

An interval between the ground via holes may be narrower than that between the signal via holes.

The reinforcing pads may be connected with a ground portion of the first circuit board or the second circuit board.

The reinforcing pads may be arranged along a circumference of the block body.

The reinforcing pads may have an oblong shape of which length direction is arranged along the circumference of the block body.

Screw holes may be formed in each of the first circuit board, the second circuit board and the interposer block and arranged to be overlapped with each other, and the reinforcing pads may be arranged around the screw holes.

The block body may have a side exposed without plating.

The first circuit board and the second circuit board may be long in a first direction, and the interposer blocks may be arranged to be spaced from each other in the first direction.

The substrate layered structure may further comprise an antenna radiator formed at an end of a second direction vertical to the first direction of the first circuit board or the second circuit board.

The substrate layered structure may further comprise a plurality of alignment holes formed in the first circuit board; and a plurality of alignment pins packaged in the second circuit board and respectively inserted into the alignment holes.

The alignment pins may include a first portion fixed to the second circuit board, having a diameter greater than that of the alignment hole, and a second portion extended from the first portion and inserted into the alignment hole.

The first portion may have a height corresponding to that of the interposer block.

In another aspect of the present disclosure, an interposer block comprises a block body including a dielectric; a plurality of signal via holes transferring a signal by passing through the block body; a plurality of signal pads arranged at both ends of the signal via holes and connected with the first circuit board and the second circuit board; and reinforcing pads arranged on one surface and the other surface of the block body, having a size greater than that of the signal pad.

The interposer block may further comprise a plurality of ground via holes arranged between the reinforcing pads.

An interval between the ground via holes may be narrower than that between the signal via holes.

The reinforcing pads may be connected with a ground portion of the first circuit board or the second circuit board.

The reinforcing pads may have an oblong shape of which length direction is arranged along the circumference of the block body.

The block body may have a side exposed without plating.

The substrate layered structure according to the present disclosure may make sure of a packaging area on a substrate.

The substrate layered structure according to the present disclosure may form a pattern for radio signal radiation, such as antenna, due to an edge portion of the substrate, which may be exposed.

The interposer may enhance a coupling force between substrates by complementing impact.

A noise shielding effect may be obtained even though plating is omitted for a side of the interposer.

Since an under fill work of the interposer may be omitted, a process may be simplified and the substrate layered structure may easily be detached and reassembled.

Since the substrate layered structure according to the present disclosure does not need a separate jig for layering, the manufacturing cost may be reduced and the manufacturing process may be simplified.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings, which are given by illustration only, and thus are not limitative of the present disclosure, and wherein.

DETAILED DESCRIPTION OF THE INVENTION

Figure 1A:
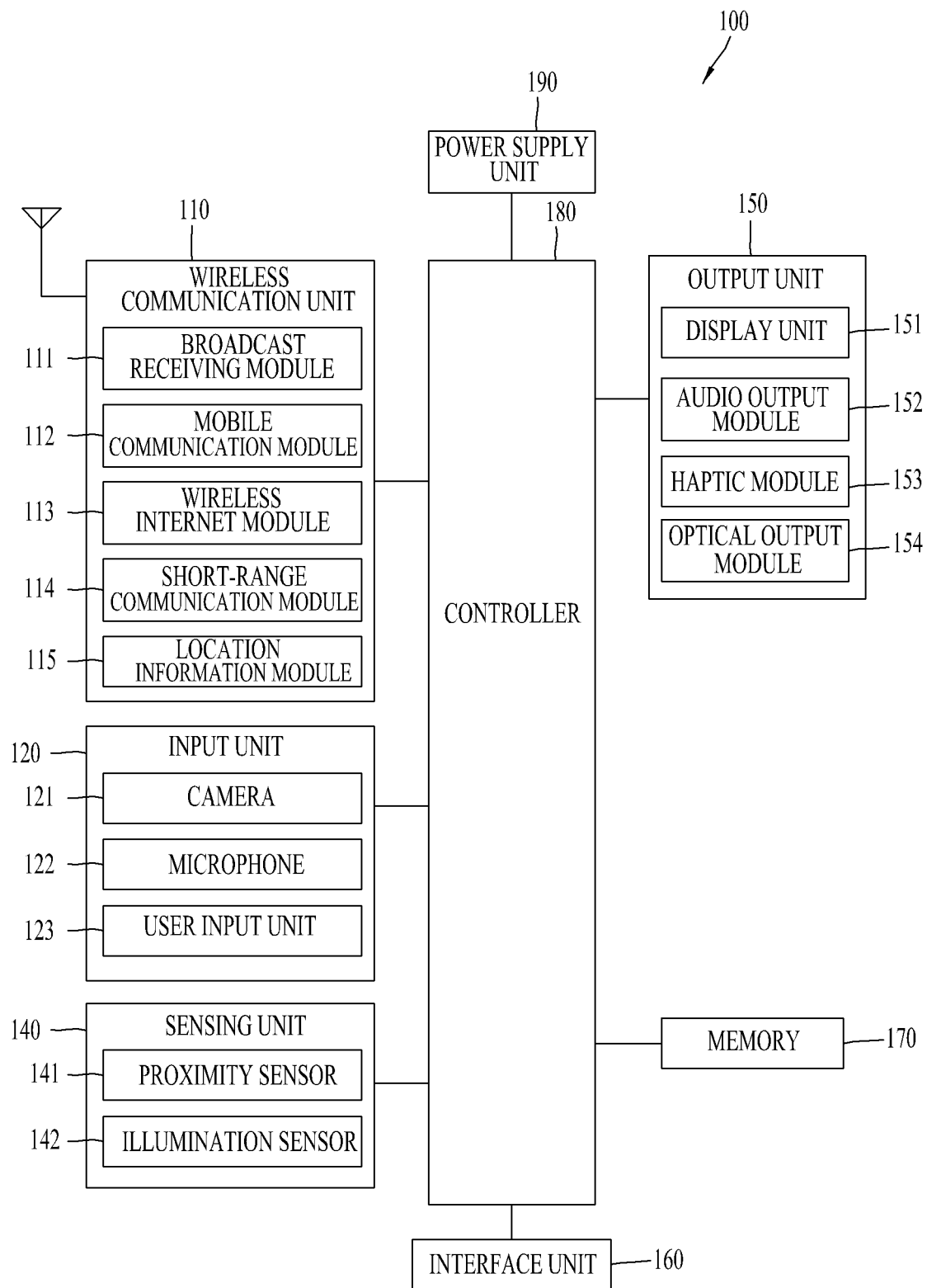
FIG. 1A is a block diagram of a mobile terminal in accordance with the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
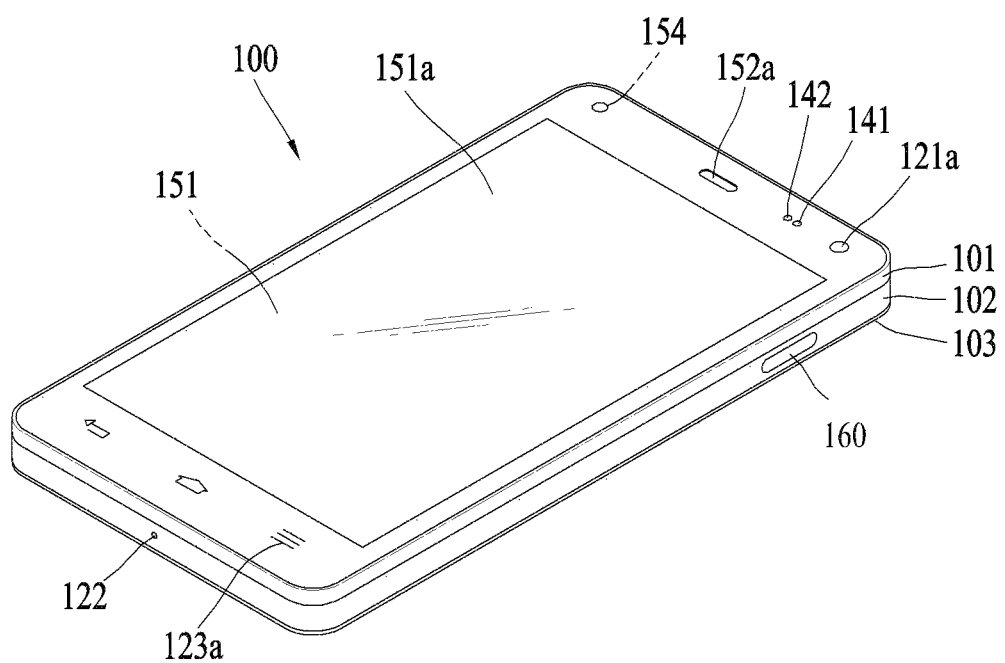
FIGS. 1B and 1C are conceptual views of one example of the mobile terminal, viewed from different directions.
Figure 1C:
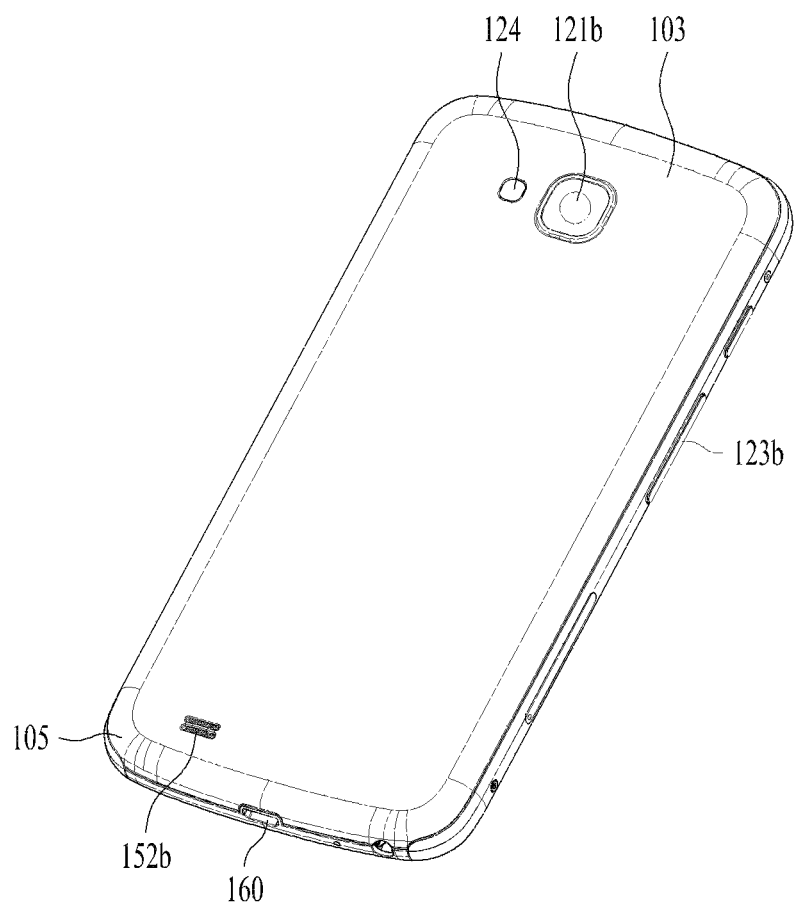

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. Referring now to FIG. 1A, the mobile terminal 100 is shown having wireless communication unit 110 configured with several commonly implemented components. It is understood that implementing all of the illustrated components is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Hereinafter, referring to FIG. 1A, the components mentioned above will be described in detail before describing the various embodiments which are realized by the mobile terminal 100 in accordance with the present disclosure.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like). Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, w % ben the mobile terminal uses the Wi-Fi module, a position of the mobile terminal can be acquired based on information related to a wireless access point (AP) which transmits or receives a wireless signal to or from the Wi-Fi module.

The input unit 120 may be configured to permit various types of input to the mobile terminal 120. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like. The controller 180 generally cooperates with the sensing unit 140 to control operation of the mobile terminal 100 or execute data processing, a function or an operation associated with an application program installed in the mobile terminal based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor. Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

In some embodiments, the display unit 151 may be implemented as a stereoscopic display unit for displaying stereoscopic images. A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 may be provided with the power supplied by an external power source and the power supplied therein under the control of the controller 180 so as to supply the needed power to each of the components. The power supply unit 190 may include a battery. The battery may be a built-in type which is rechargeable and detachably loaded in the terminal to be charged.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, cliptype, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well. Here, the terminal body may be understood to refer to the concept of this bore a mobile terminal (100) to at least one of the aggregate.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like. As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include the display unit 151, the first and second audio output modules 152a and 152b, the proximity sensor 141, the illuminance sensor 142, the optical output module 154, the first and second cameras 121a and 121b, the first and second manipulation units 123a and 123b, the microphone 122 and the interface unit 160.

It will be described for the mobile terminal as shown in FIGS. 1B and 1C. The display unit 151, the first audio output module 152a, the proximity sensor 141, an illumination sensor 142, the optical output module 154, the first camera 121a and the first manipulation unit 123a are arranged in front surface of the terminal body, the second manipulation unit 123b, the microphone 122 and interface unit 160 are arranged in side surface of the terminal body, and the second audio output modules 152b and the second camera 121b are arranged in rear surface of the terminal body.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a. The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof. Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

A flash 124 is shown located adjacent to the second camera 121b. When an image of a subject is captured with the camera 121b, the flash 124 may illuminate the subject.

The second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (see FIG. 1A) may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body. The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Figure 2:
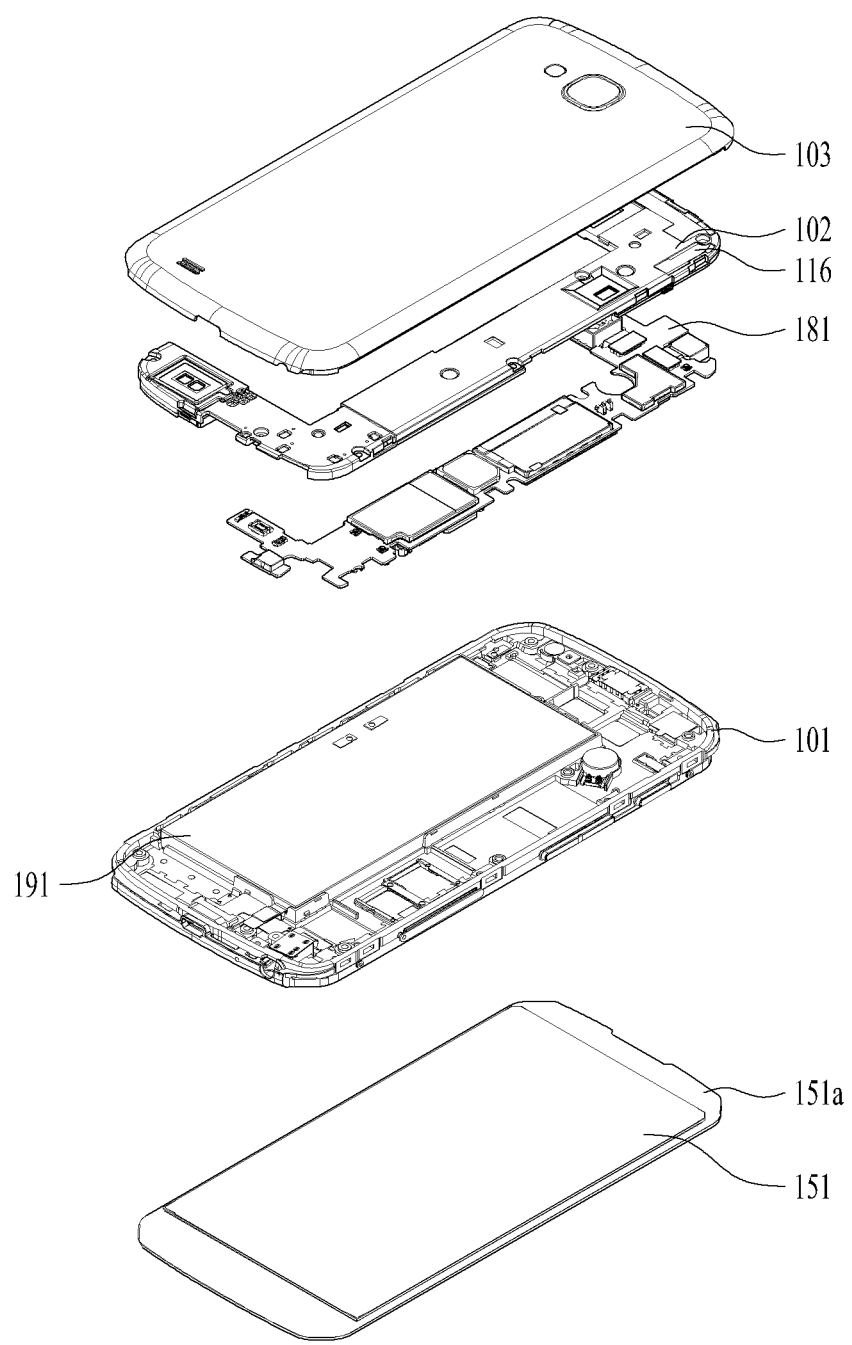
FIG. 2 is an exploded perspective view of a mobile terminal according to the present disclosure.

FIG. 2 is an exploded perspective view of the mobile terminal 100 according to the present disclosure. According to the mobile terminal 100 of the present disclosure, various components such as the battery 191, the main board 181, the camera 121 and the audio output module 152 are packaged the inside surrounded by the front case 101 and the rear case 102, and the front case 101, the rear case 102 and the window 151a covering the front surface of the display unit 151 may partially be exposed to the outside, whereby the appearance of the mobile terminal 100 may be configured.

The front case 101 may be configured to reinforce rigidity of the mobile terminal 100 while supporting the rear surface of the display unit 151 by including a plate of a metal material, may form a bump by coupling a jet to the plate of the metal material through insert injection such that various components may be packaged in the bump, and may be configured to be partially be exposed to the outside of the mobile terminal 100.

The display unit 151 is coupled to the front surface of the front case 101, and the window 151a coupled to the front surface of the display unit 151 configures the front surface of the mobile terminal 100. The front case 101 may partially be exposed around the display unit 151, and a glass of the window 151a may configure a whole appearance of the front surface.

The mobile terminal may further include a side case partially covering sides of the rear case 102 and the front case 101. A material different from those of the rear case 102 and the front case 101 may be used as the side case. If the side case includes a metal material, an appearance design which is more refined may be provided, and rigidity of the mobile terminal 100 may be reinforced.

As a multimedia function of the mobile terminal is emphasized, battery consumption is increased, whereby the battery is arranged to occupy the largest area inside the mobile terminal. The components such as a camera, an audio output unit and a speaker may be arranged using upper and lower spaces of the battery, and a main board may be arranged in a lateral direction of the battery.

The main board may have a long shape in an up and down direction of the mobile terminal, or may have a ⊏ shape even by using upper and lower portions of the battery. An electronic chip (IC) such as an application processor (AP) is packaged in the main board, and the main board serves as a controller of the mobile terminal. A shield can may be packaged in the board to protect the electronic chip. An element such as the electronic chip and the shield can may be packaged in the board in the manner of SMT (Surface Mounter Technology).

The SMT scheme enables automation of assembly due to systemization of the process and therefore enhances productivity. Also, since the SMT scheme may package an element at high density, a size of the board may be reduced, and reliability and performance of the product may be improved.

As the size of the mobile terminal 100 is recently reduced, or as various components for various functions are packaged, a packaging space inside the mobile terminal is reduced. For example, as types of the camera 121 are diversified, a packaging space of the camera inside the mobile terminal 100 should be ensured. In order to diversify wireless communication standards and cover signals of various frequency bands, the number of antennas 116 is increased. Additional sensor for acquisition of biometric information such as fingerprint is required. When the size of the mobile terminal is varied, a space where the driving unit for a variable size will be packaged is required.

Figure 3:
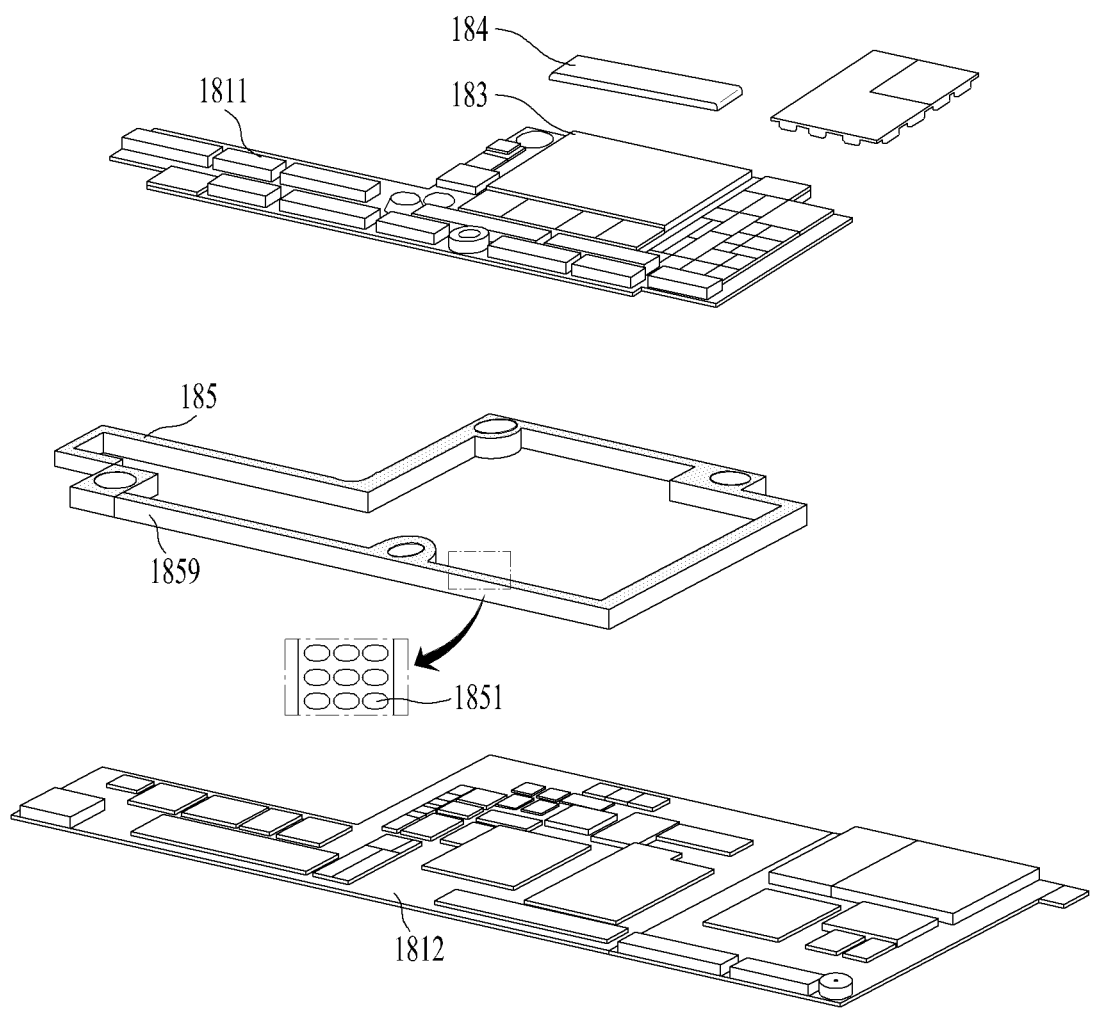
FIG. 3 is an exploded perspective view of a substrate layered structure of the related art.

FIG. 3 is an exploded perspective view of a substrate layered structure of the related art. In order to use a limited packaging space of the mobile terminal to the maximum, the main board may be configured as a substrate layered structure 181 in which multiple substrates 1811 and 1812 are layered.

The substrate layered structure 181 includes an interposer 185 arranged between the substrates 1811 and 1812 to transmit a signal between the substrates 1811 and 1812 by making sure of a space between the substrates 1811 and 1812 through overlap arrangement of at least two substrates 1811 and 1812 and provided with a plurality of via holes 1851. Considering a thickness of the mobile terminal, two substrates 1811 and 1812 are preferably layered, and three or more substrates 1811 and 1812 may be layered if necessary. The substrates 1811 and 1812 correspond to a first circuit board and a second circuit board, respectively, and as shown can be printed circuit boards used in the operation of the mobile terminal.

As shown in FIG. 3, the first circuit board 1811 and the second circuit board 182 may be different from each other in size. In addition, the interposer 185 is disposed at the portion where the first circuit board 1811 and the second circuit board 1812 overlap with each other. The interposer 185 shown in FIG. 3 has a loop shape arranged around the first circuit board 1811 and the second circuit board 1812. However, the interposer 185 of the loop shape has a problem in that an area reserved by the interposer 185 on the substrate is increased. Also, since a signal moves through the interposer 185, it is required to shield noise. Thus, metal plating 1859 is performed on a side portion of the interposer 185 to shield noise.

However, an additional plating process for edge plating 1859 on the first circuit board 1811 and the second circuit board 1812 is required. Since the edge plating 1859 shields a signal, an antenna cannot be implemented by forming a metal pattern in the first circuit board 1811 and the second circuit board 1812.

Figure 4:
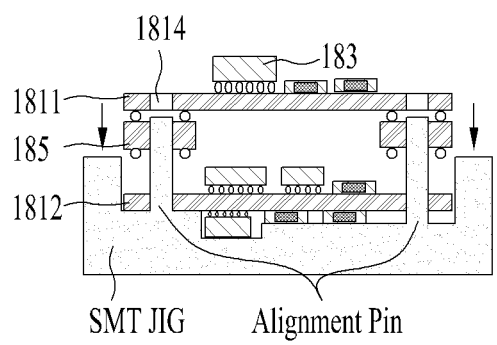
FIG. 4 is a view illustrating a manufacturing process of a substrate layered structure according to the related art.
Figure 4:
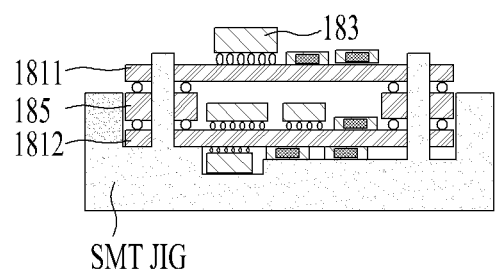
Figure 4:
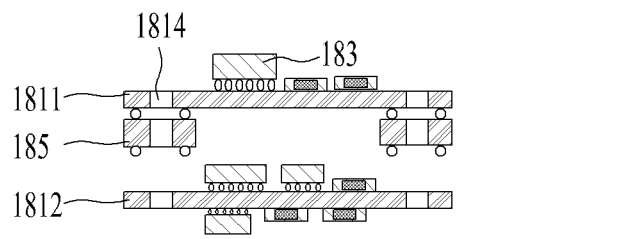
Figure 4:
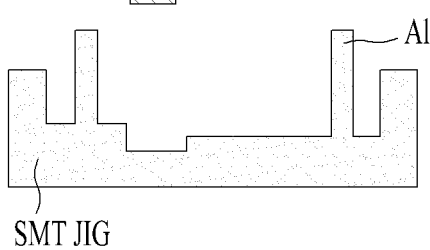
Figure 4:
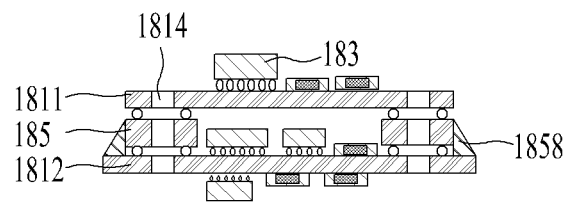

Next, FIG. 4 is a view illustrating a manufacturing process of a substrate structure according to the related art. Position alignment between the substrates 1811 and 1812 is required to layer the substrate structure of the related art. For position alignment, a jig having alignment pins may be used as shown in FIG. 4(a). Alignment holes 1814 for insertion of the alignment pins may be formed in the first circuit board 1811, the second circuit board 1812 and the interposer 185. The second circuit board 1812, the interposer 185 and the first circuit board 1811 (or inverse order) are sequentially layered on the jig, and at the same time a signal pad of the interposer 185 is connected with a signal line of the first circuit board 1811 and the second circuit board 1812 by soldering (FIG. 4(b)).

After soldering, as shown in FIG. 4(c), the substrate layered structure is detached from the jig. Since the interposer 185 is thin and long, a problem occurs in that the interposer 185 is easily damaged. Therefore, it is required to reinforce coupling between the substrate and the interposer 185. A coupling liquid may be deposited and hardened on the side of the interposer 185 and the substrate to enhance a coupling force between the substrate and the interposer 185, whereby an under fill work for adding a support structure 1858 may be performed.

This process includes layering the substrate layered structure on the jig and detaching the substrate layered structure from the jig, and a yield is determined in accordance with the number of jigs, whereby a problem occurs in that there is difficulty in mass production. Also, since the under fill work should be performed again, a problem occurs in that the process is delayed.

In order to solve the structural problem of the substrate layered structure of the related art and implement the process for mass production, instead of the loop type interposer 185, a block type interposer may be used.

Figure 5:
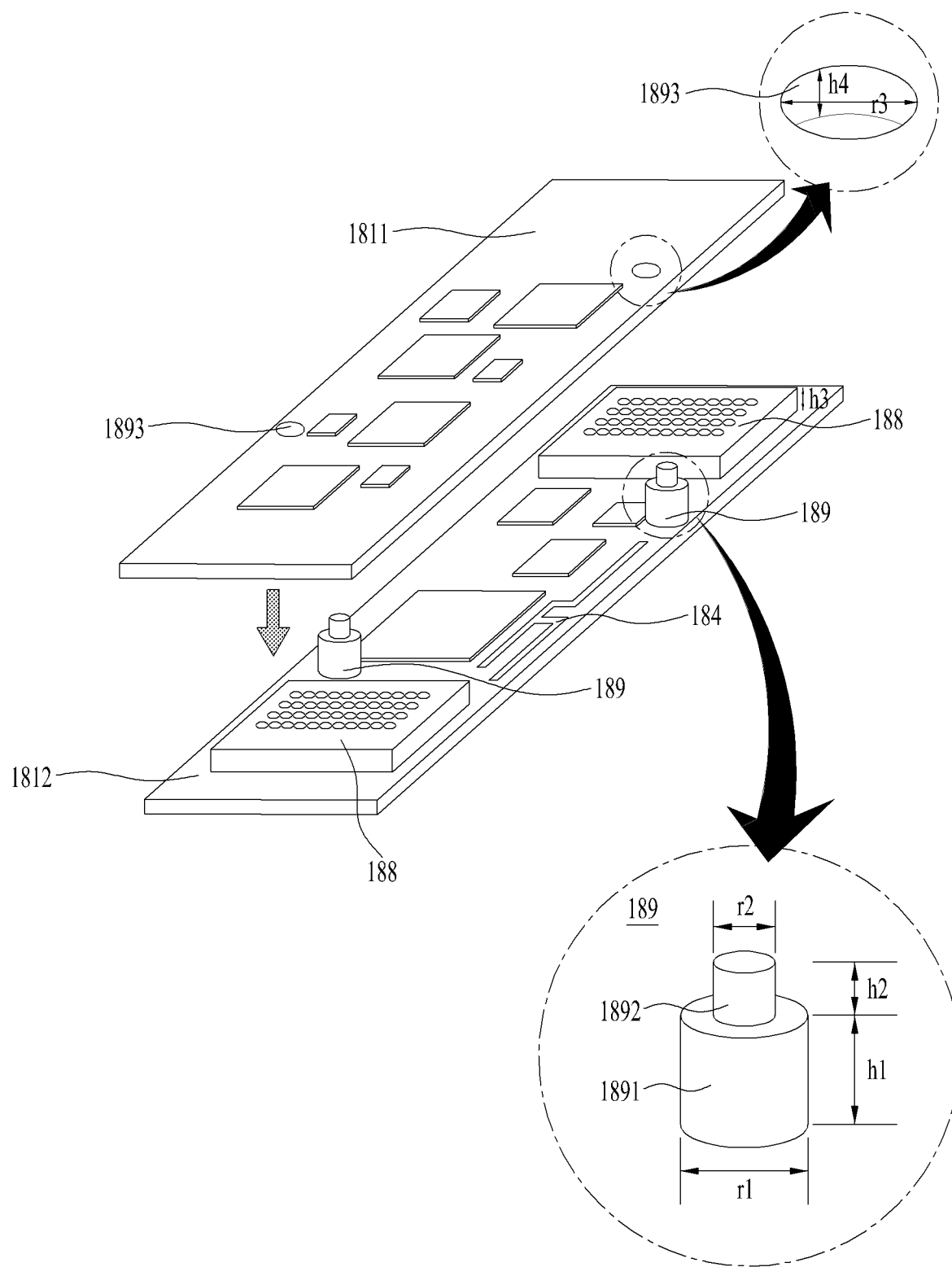
FIG. 5 is an exploded perspective view of a substrate layered structure according to the present disclosure.
Figure 6:
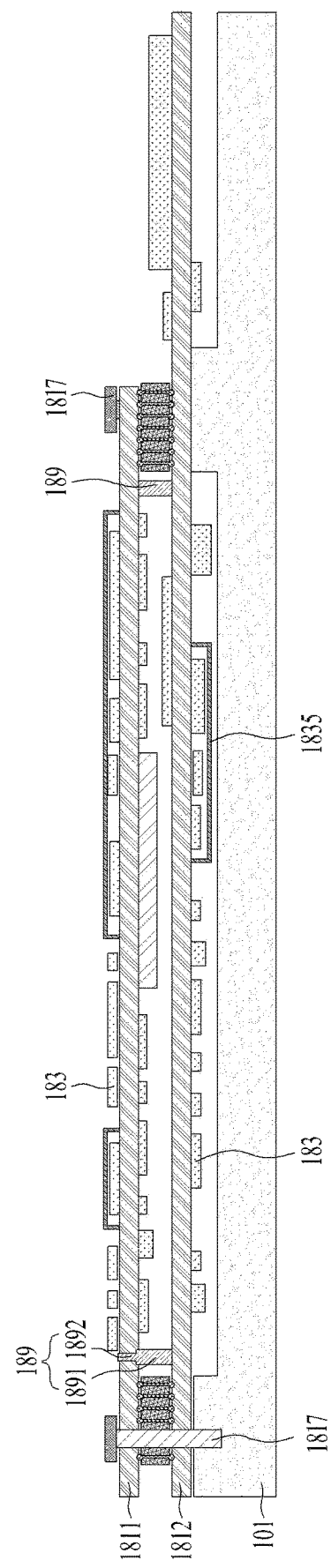
FIG. 6 is a cross-sectional view of a substrate layered structure according to the present disclosure.

In particular, FIG. 5 is an exploded perspective view of a substrate layered structure 181 according to the present disclosure, and FIG. 6 is a cross-sectional view of a substrate structure 181 according to the present disclosure. In addition, FIG. 6 is a cross-sectional view taken along a first direction, that is, a length direction of the substrate layered structure 181.

The first circuit board 1811, the second circuit board 1812, and a pair of interposer blocks 188 arranged between the first circuit board 1811 and the second circuit board 1812 are shown. The interposer may be provided in a block shape instead of a loop shape surrounding a circumference of the substrate, and therefore can be disposed on two or more positions of the substrate.

Since the loop type interposer 185 is thin and long, a problem of a damage may occur, and it is difficult to align the interposer due to a large size. However, the interposer block 188 has little a risk of damage and its alignment is simple due to a small size.

Figure 7:
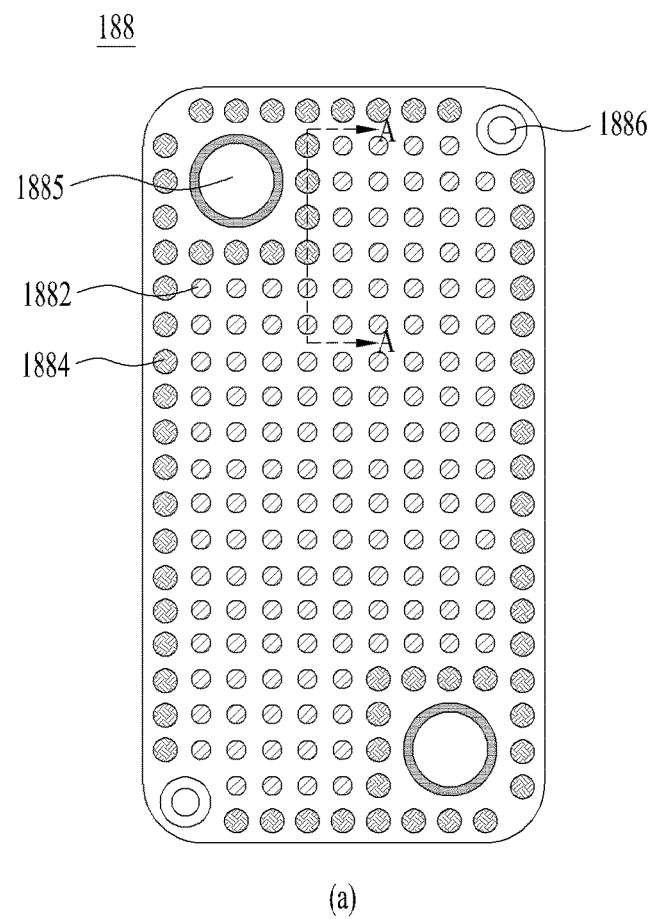
FIGS. 7 and 8 are views illustrating an interposer according to the present disclosure.
Figure 7:
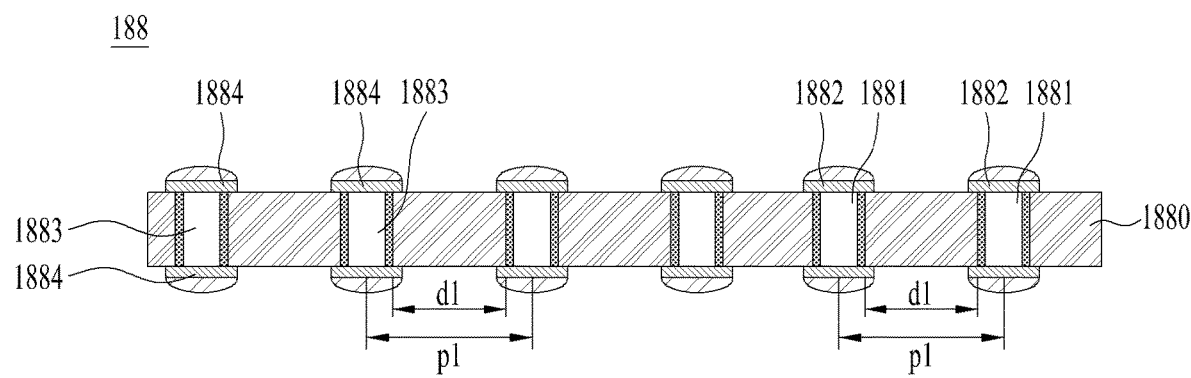
Figure 9:
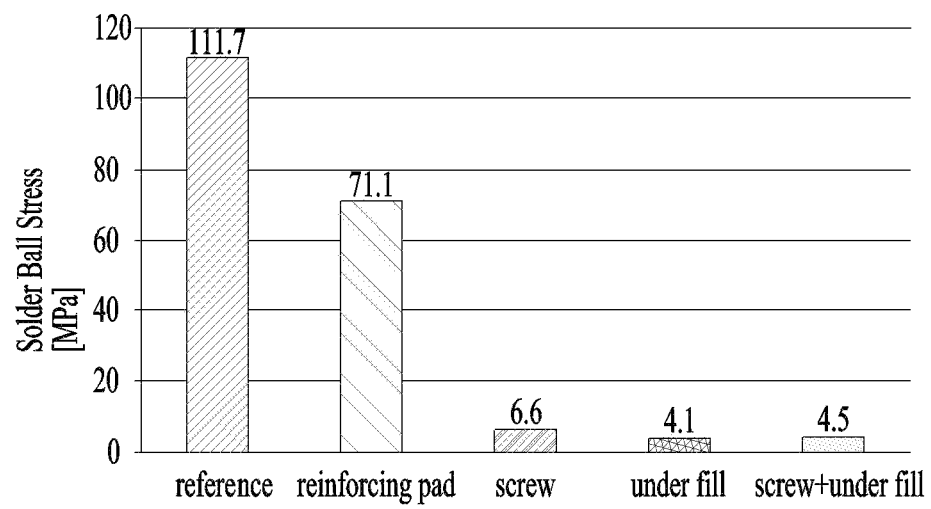
FIG. 9 is a graph illustrating stress applied to a solder of a substrate layered structure.
Figure 9:
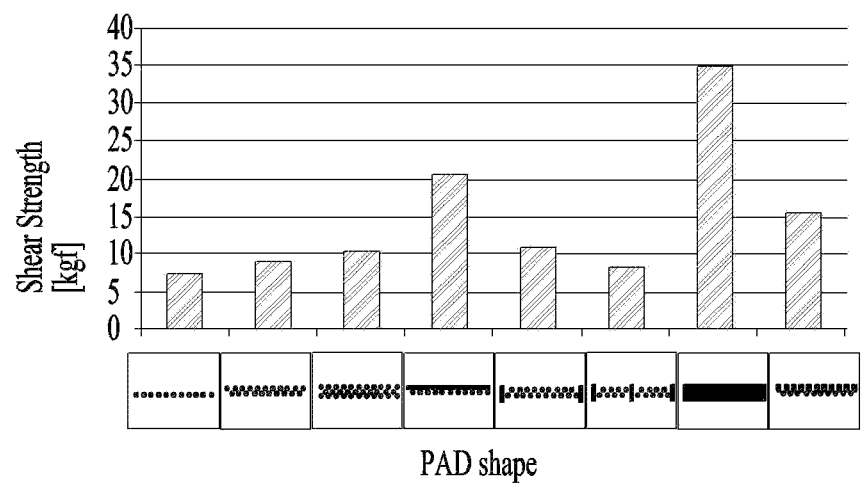

Also, an area reserved by the interposer block 188 on the substrates 1811 and 1812 is smaller than that of the loop type interposer 185, the size of the substrate layered structure 181 can be reduced, and space utilization inside the mobile terminal 100 can be enhanced. As shown in FIG. 5, if two or more interposer blocks 188 are arranged to be spaced apart from each other in a length direction of the substrates 1811 and 1812, a coupling force between the first circuit board 1811 and the second circuit board 1812 can be enhanced. FIGS. 7 and 9 are views illustrating the interposer block 188 according to the present disclosure in which (a) is a plane view, and (b) is a cross-sectional view of A-A. Since an opposite surface of the interposer block 188 has the same structure as (a), its drawing is omitted.

The interposer block 188 includes a block body 1880 including a dielectric, a plurality of signal via holes 1881 for transferring a signal between the first circuit board 1811 and the second circuit board 1812 by passing through the block body 1880, and a plurality of signal pads 1882 arranged at both ends of each of the signal via holes 1881 and connected to the first circuit board 1811 and the second circuit board 1812.

The signal pads 1882 are soldering portions for connection with the first circuit board 1811 and the second circuit board 1812, and are arranged at both ends of the signal via holes 1881. Although FIG. 6 shows the signal pads 1882, since the signal pads 1882 are arranged to correspond to the signal via holes 1881, arrangement of the signal via holes 1881 will be described with reference to FIG. 7(a).

Since the interposer 185 of the related art has a narrow width, two or three signal via holes can be arranged in a width direction. However, in the interposer 188 of the present disclosure, five or more signal via holes 1881 can be arranged in a width direction. If the signal via holes 1881 are arranged in the form of array as shown in FIG. 7(a), several signal via holes 1881 can be arranged in a limited space.

The number of arranged via holes can be varied depending on the size of the interposer block 188 and the interval of the via holes 1881 and 1883, and 150 to 210 via holes may exist per interposer block.

The signal via holes can be formed by forming holes in the block body 1880 to have a predetermined interval and plating surfaces of the holes. An end portion of the via hole may include a via pad 1882 greater than a diameter of the via hole for connection with the first circuit board 1811 and the second circuit board 1812. The via pad 1882 may be attached to the first circuit board 1811 and the second circuit board 1812 through a soldering process, and is coupled with the first circuit board 1811 and the second circuit board 1812 electrically and physically.

If the interval between the signal via holes is too great, the size of the block becomes great, and if the interval between the signal via holes is too small, signal interference may occur between the signal via holes or the via pads 1882 may be adhered to each other, whereby the signal via holes may be arranged at an interval of 0.6 mm or more and 0.8 mm or less.

For example, the holes may be formed in the block body 1880 such that the interval between the signal via holes may be 0.7 mm and the size of the signal via hole may be 0.2 mm, and the via pad 1882 having a diameter of 0.4 mm may be formed on the surface of the block body 1880 such that it may be connected with both ends of the signal via holes. In this embodiment, the interval between the signal via holes is 0.5 mm, and the interval between the via pads 1882 is 0.3 mm.

If the substrate is coupled with the interposer block by soldering between the via pad 1882 and the substrate, a crack may occur in connection between the via pad 1882 and the substrate due to external impact. In this case, no signal is transmitted between the first circuit board and the second circuit board, whereby an error may occur in the product and an error operation may be caused.

An element for enhancing a coupling force of the substrate layered structure 181 is additionally required so as not to generate a crack in soldering even in case of external impact, and to this end, a screw passing through the first circuit board, the interposer block and the second circuit board may be used. The screw may enhance a coupling force among the first circuit board, the interposer block and the second circuit board, and the substrate layered structure 181 may be coupled to the case 101 by a screw 1817.

As shown in FIG. 6, the screw 1817 can be coupled to the case 101 by passing through the first circuit board 1811, the second circuit board 1812 and the interposer block 188, and a screw hole 1885 through which the screw 1817 passes may be formed in each of the first circuit board 1811, the second circuit board 1812 and the interposer block 188. The screw holes of the first circuit board 1811, the second circuit board 1812 and the interposer block 188 can also be aligned in the thickness direction of the mobile terminal and continuously arranged.

Two or more screw holes 1885 may be formed in the interposer block 188, and as shown in FIG. 7(a), the screw holes 1885 can be arranged to be spaced apart from each other to enhance a coupling force based on the screw 1817. The screw 1817 passing through the substrate layered structure 181 may be connected with the metal plate of the case 101. Since the metal plate can serve as a ground, a ground portion of the substrate can be electrically connected with a metal portion of the case.

Next, FIG. 9 is a graph illustrating a stress applied to a solder of the substrate layered structure 181. Referring to FIG. 9, the via pad 1882 is coupled between the substrates by soldering without a separate structure, and the stress applied to the solder is the largest. As described with reference to FIG. 4, if the under fill 1858 is used, a coupling force between the substrates may be enhanced, whereby stress may be reduced. However, the under fill 1858 needs an additional process, and if the interposer should be detached for repair of the product, it is difficult to remove the under fill 1858, the substrate layered structure 181 should be exchanged with new one.

Therefore, if the screw passing through the first circuit board 1811, the second circuit board 1812 and the interposer block 1888 is used, the substrate layered structure 181 can be fixed to the case and at the same time a coupling force between the substrate layered structures 181 can be improved, and maintenance can easily be performed.

If the substrate layered structures 181 are coupled using the screw, a coupling force may be enhanced but stress may be concentrated around the screw, whereby the signal via holes arranged around the screw hole 1885 may be vulnerable. If the via hole adjacent to the screw hole 1885 is used as a ground via hole 1883 for ground instead of the signal via hole for signal transmission, even though a crack occurs in a solder of some via holes, it does not affect the functions of the mobile terminal. Since a circumference of the interposer block as well as a circumference of the screw hole 1885 is most directly subjected to impact, the via holes placed the circumference of the interposer block may be used as the ground via hole 1883.

Figure 8:
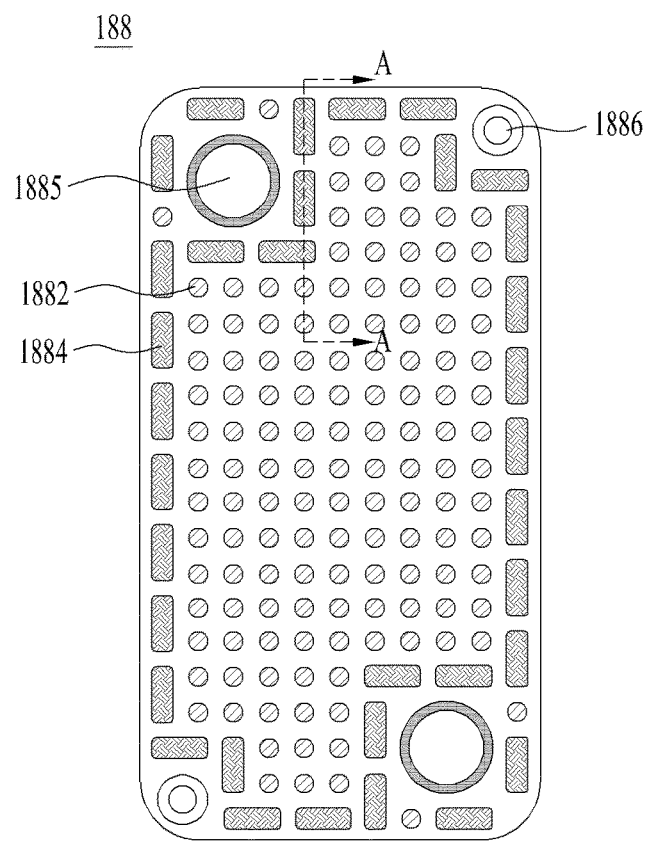
Figure 8:
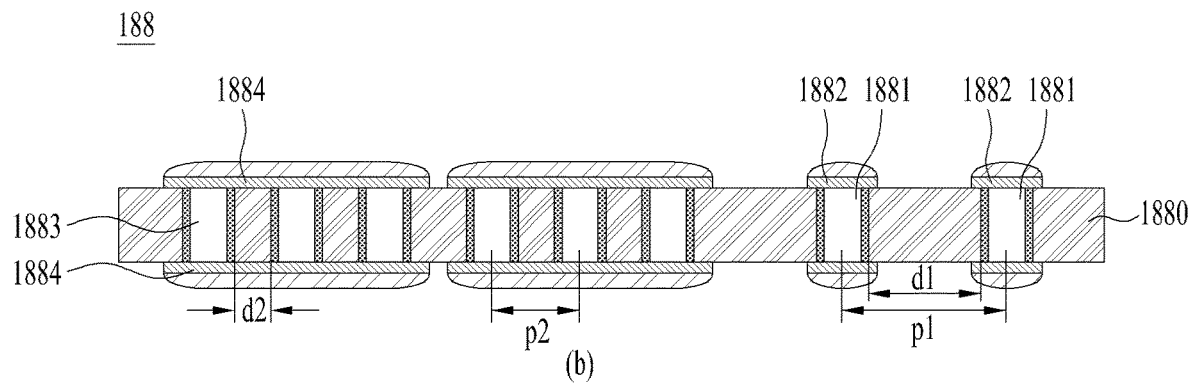

In addition, FIG. 8 illustrates another embodiment of the interposer block 188. The via pad 1884 corresponding to the ground via hole 1883 may be formed as a reinforcing pad 1884 connecting the plurality of ground via holes 1883. The reinforcing pad 1884 is connected with the ground of the first circuit board or the second circuit board without transmitting a signal.

Since the reinforcing pad 1884 has an area greater than that of the via pad 1882, a coupling force may be enhanced, and if the reinforcing pad 1884 is applied as shown in the graph of FIG. 9(a), the stress applied to the solder is reduced compared to coupling based on the via pad 1882 only.

Since the ground via holes 1883 are substantially grounded and electrically connected, even though a plurality of grounds are connected using one reinforcing pad 1884, it does not affect the functions of the mobile terminal. Although the ground via holes 1883 may have the same interval as that of the signal via holes, as shown in FIG. 8(b), the interval between the ground via holes 1883 may be narrower than that between the signal via holes 1881.

Further, the signal via holes 1881 can be arranged to be spaced apart from each other at a first distance d1 to avoid interference between signals transferred from each via hole, and the ground via holes 1883 are arranged to be spaced apart from each other at a second distance d2 narrower than the first distance d1 to allow noise not to pass through the via holes, thereby shielding noise.

If the distance between the ground via holes 1883 is short, a shielding power is high but it is difficult to form the ground via holes 1883. Therefore, the ground via holes 1883 may be arranged such that the second distance d2 ranges from 0.4 mm to 0.6 mm. If the interval between the ground via holes 1883 is 0.6 mm or more, since noise passes through the ground via holes, the ground via holes may be arranged such that their interval is 0.6 mm or less. The block body 1880 is subjected to laser process to form the via holes, and considering a minimum interval for forming via holes, the block body may be configured to have an interval of 0.4 mm or more.

In this embodiment, considering array and arrangement of the signal via holes 1881, three ground via holes 1883 may be arranged in the space where two signal via holes 1881 are arranged (p1>p2). The interval between the ground via holes 1883 connected to individual reinforcing pads 1884 may be equal to or greater than the interval between the ground via holes 1883 connected to one reinforcing pad 1884. Even though the intervals d2 between the respective ground via holes 1883 may be different, the ground via holes 1883 may be formed to have an interval ranging from 0.4 mm to 0.6 mm as described above.

That is, the ground via holes 1883 may prevent noise from entering the signal via holes 1881 and at the same time may serve as connector to the ground. Since the ground via holes 1883 are arranged around the interposer block 188 to shield noise, edge plating 1859 formed around the aforementioned block body 1880 may be omitted.

In addition, the reinforcing pad 1884 can enhance a coupling force of the substrate layered structure 181 by making sure of a wide coupling area with the substrate. Particularly, as shown in FIG. 7(a) and FIG. 8(a), the reinforcing pad 1884 can be arranged along the circumference of the interposer block 188 to enhance the coupling force. Since a separate under fill process is not required due to a high coupling force, the process can be simplified, and a packaging area of the interposer block 188 can be reduced to make sure of a component packaging area on the substrate.

Referring to FIG. 5, the substrate may have a long shape in a first direction. As shown in FIG. 2, the substrate layered structure 181 packaged in the mobile terminal of a bar shape may be formed longitudinally in the first direction (up and down direction) next to a battery packaging unit. Further, an antenna pattern 184 can be formed at a portion of the substrate layered structure 181, which is adjacent to the end portion of the mobile terminal 100, and be used as a radiator for transmitting or receiving a signal.

However, the interposer 185 of the related art includes a shielding structure (edge plating 1859) for shielding noise. Therefore, the interposer 185 surrounding the circumference of the substrate assembly body like the related art disturbs signal radiation of an antenna radiator formed on the substrate. Therefore it is difficult to implement an antenna radiator on the substrate assembly.

However, if the interposer block 188 shown in FIG. 5 is used, no metal is arranged at both ends in a second direction vertical to the first direction. A metal pattern 184 can be formed at the end portion in the second direction of the substrates 1811 and 1812 to implement an antenna radiator.

If the substrates are layered using a jig having alignment pins like the substrate layered structure 181 of the related art described with reference to FIG. 4, the process steps are increased, whereby the manufacturing cost is increased. In order to solve this problem, alignment pins 189 are directly packaged in the substrates 1811 and 1811, whereby the substrates may be layered without a jig having alignment pins. Since the alignment pins 189 can be packaged together with another component in the manner of SMT when another component is packaged, the alignment pins 189 can be packaged without additional process.

In addition, the first circuit board 1811 can be provided with alignment holes 1893 formed at positions corresponding to the alignment pins 189, and if the alignment pins 189 are inserted into the alignment holes 1893 of the first circuit board 1811, the first circuit board 1811 can be arranged at an exact position on the second circuit board 1812. For positioning of the substrates in x-axis and y-axis directions, two or more alignment pins 189 may be provided as shown in FIG. 5.

For positioning on z-axis, the alignment pins 189 may include a first portion 1891 arranged between the first circuit board 1811 and the second circuit board 1812 and a second portion 1892 inserted into the first circuit board 1811. Since the first portion 1891 has a diameter than greater than that of the alignment hole 1893 formed in the first circuit board 1811, the first portion 1891 may be arranged between the first circuit board 1811 and the second circuit board 1812 without being inserted into the alignment hole 1893. The second portions 1892 of the multiple alignment pins 189 may have the same height to arrange the first circuit board 1811 and the second circuit board 1812 at a constant interval (distance in z-axis direction). The height of the second portion 1892 of the alignment pin 189 may be formed to correspond to a height h3 of the interposer block 188 such that the interposer block 188 may stably guide connection between the first circuit board 1811 and the second circuit board 1812.

The second portion 1892 may be formed to have a diameter r2 corresponding to a diameter r3 of the alignment hole 1893 and therefore inserted into the alignment hole 1893. A height h2 of the second portion 1892 may be formed to correspond to a height h4 (thickness) of the first circuit board 1811. The alignment hole 1893 of the first circuit board 1811 may be inserted into the second portion 1892 of the alignment pin 189 packaged in the second circuit board 1812 such that the first circuit board 1811 and the second circuit board 1812 may be aligned. Afterwards, the signal pad 1882 and the reinforcing pad 1884 of the interposer 185 may be coupled with the first circuit board 1811 by heat.

The first portion 1891 of the alignment pin 189 has a height corresponding to a thickness of the interposer block 188, and the second portion 1892 corresponds to the thickness of the first circuit board 1811 and is inserted into the alignment hole 1893. In this way, the alignment pin 189 can be easily packaged in the second circuit board 1812 by SMT process, and a separate jig is not required for layering, whereby the process is simplified.

In order that the interposer block 188 is exactly arranged on the first circuit board and the second circuit board, the interposer block 188 may further include an alignment protrusion 1886 for positioning like the alignment pin 189 on the substrate, and the substrate may further include an alignment hole corresponding to the alignment protrusion 1886. The substrate layered structure 181 according to the present disclosure can secure a packaging area on the substrate.

The substrate layered structure 181 according to the present disclosure can form an antenna pattern for radio signal radiation due to the edge portion of the substrate, which may be exposed. Further, the interposer enhances a coupling force between the substrates by complementing impact. A noise shielding effect may also be obtained even though edge plating is omitted for the interposer.

Since the under fill work of the interposer can be omitted, the process is simplified and the substrate layered structure can be easily detached and reassembled. Also, since the substrate layered structure 181 according to the present disclosure does not need a separate jig for layering, the manufacturing cost is reduced and the manufacturing process is simplified.

It will be apparent to those skilled in the art that the present disclosure may be embodied in other specific forms without departing from the spirit and essential characteristics of the disclosure. Thus, the above embodiments are to be considered in all respects as illustrative and not restrictive. The scope of the disclosure should be determined by reasonable interpretation of the appended claims and all change which comes within the equivalent scope of the disclosure are included in the scope of the disclosure.

What is claimed is:

1. A substrate layered structure comprising:
    a first circuit board;
    a second circuit board overlapping the first circuit board;
    interposer blocks interposed between the first circuit board and the second circuit board and spaced apart from each other in a first direction; and
    an antenna radiator formed at an end of a second direction vertical to the first direction of the first circuit board or the second circuit board,
    wherein each corresponding interposer block includes:
    a dielectric block body;
    a plurality of signal via holes passing through the dielectric block body and transferring signals between the first circuit board and the second circuit board; and
    a plurality of signal pads arranged at first ends of the signal via holes and connected to the first circuit board and arranged at second ends of the signal via holes and connected to the second circuit board.

2. The substrate layered structure of claim 1, wherein each corresponding interposer block further includes reinforcing pads arranged on top and bottom surfaces of the block body, and
    wherein a single reinforcing pad has a size greater than a size of a single signal pad.

3. The substrate layered structure of claim 2, further comprising:
    a plurality of ground via holes passing through the dielectric block body and providing a ground for the first circuit board and the second circuit board,
    wherein one reinforcing pads covers multiple ground via holes.

4. The substrate layered structure of claim 3, wherein an interval between the ground via holes is narrower than an interval between the signal via holes.

5. The substrate layered structure of claim 3, wherein the reinforcing pads are connected with a ground portion of the first circuit board or the second circuit board.

6. The substrate layered structure of claim 2, wherein the reinforcing pads are arranged along a circumference of the dielectric block body.

7. The substrate layered structure of claim 6, wherein the reinforcing pads have an oblong shape with a length direction arranged along the circumference of the dielectric block body.

8. The substrate layered structure of claim 2, wherein the interposer blocks include a first interpose block and a second interpose block spaced apart from the first interposer block,
    wherein a first screw hole is formed through the first circuit board, the first interposer block, and the second circuit board,
    wherein a second screw hole is formed through the first circuit board, the second interposer block and the second circuit board, and wherein the reinforcing pads are arranged around the first and second screw holes.

9. The substrate layered structure of claim 1, wherein the dielectric block body has an exposed side without plating.

10. The substrate layered structure of claim 1, wherein the first circuit board and the second circuit board are longer in the first direction.

11. The substrate layered structure of claim 1, further comprising:
a plurality of alignment holes formed in the first circuit board; and
a plurality of alignment pins packaged in the second circuit board and respectively inserted into the alignment holes formed in the first circuit board.

12. The substrate layered structure of claim 11, wherein the alignment pins include:
a first portion fixed to the second circuit board, and having a diameter greater than a diameter of the alignment hole; and
a second portion extended from the first portion and inserted into the alignment hole.

13. The substrate layered structure of claim 12, wherein the first portion has a height corresponding to a height of the interposer block.

14. A mobile terminal comprising:
a front case;
a rear case;
a main circuit board disposed between the front case and the rear case and including a first circuit board, a second circuit board overlapping the first circuit board, and at least first and second dielectric spacers spaced apart from each other in a first direction and interposed between the first circuit board and the second circuit board; and
an antenna radiator formed at an end of a second direction vertical to the first direction of the first circuit board or the second circuit board, wherein the first and second dielectric spacers include:
a plurality of signal holes with signal pads on both ends respectively connected to circuitry included on the first and second circuit boards for transferring signals between the first and second circuit boards; and
a plurality of ground holes providing a ground for the first and second circuit boards, and
wherein the ground holes are arranged outside of the signal holes.

15. The mobile terminal of claim 14, wherein the first circuit board includes at least one alignment hole, and
wherein the second circuit board includes at least one alignment pin inserted into the alignment hole in the first circuit board.

16. The mobile terminal of claim 14, wherein the main circuit board further includes:
a first screw hole at a first end of the main circuit board; and
a second screw hole at a second end of the main circuit board opposite to the first end, and
wherein the main circuit board is mounted to a metal plate of one of the front and rear cases via first and second screws passing through the first and second screw holes in the main circuit board and connecting to the metal plate.

17. The mobile terminal of claim 14, wherein the first and second dielectric spacers comprise a rectangular block shape.

18. The mobile terminal of claim 14, further comprising:
a first shield can covering at least one electronic chip on a lower surface of the second circuit board; and
a second shield can covering at least one electronic chip on an upper surface of the first circuit board.

19. The mobile terminal of claim 14, wherein the plurality of signal holes are arranged in a matrix form with columns and rows.

* * * * *